United States Patent [19]

Hoppe et al.

[11] Patent Number: 4,463,971

[45] Date of Patent: Aug. 7, 1984

[54] IDENTIFICATION CARD HAVING AN IC MODULE

[75] Inventors: Joachim Hoppe; Yahya Haghiri-Tehrani, both of Munich, Fed. Rep. of Germany

[73] Assignee: Gao Gesellschaft für Automation und Organisation mbH, Munich, Fed. Rep. of Germany

[21] Appl. No.: 361,660

[22] Filed: Mar. 25, 1982

[30] Foreign Application Priority Data

Apr. 14, 1981 [DE] Fed. Rep. of Germany ....... 3115045
Aug. 6, 1981 [DE] Fed. Rep. of Germany ....... 3131216

[51] Int. Cl.³ ............................................. G06K 7/08
[52] U.S. Cl. ..................................... 283/83; 283/904; 235/487; 235/488; 235/492
[58] Field of Search .............. 235/487, 488, 492, 441, 235/382, 443; 283/83, 904

[56] References Cited

U.S. PATENT DOCUMENTS 3,702,464 11/1972 Castruce .................... 340/173 SP
4,017,834 4/1977 Cuttill et al. .................... 340/149 A
4,222,516 9/1980 Badet et al. ........................ 235/492
4,380,699 4/1983 Monnier et al. .................... 235/492

Primary Examiner—A. D. Pellinen
Assistant Examiner—Robert Lev
Attorney, Agent, or Firm—Williams, Anderson & Olson Neuman

[57] ABSTRACT

An identification card or similar data carrier having an IC module for the processing of electrical signals, whereby the IC module along with its leads and contacts is arranged on a separate carrier element which is embedded in the card. An anchoring element is arranged in the area of the carrier element, which anchoring element extends beyond the edge of the carrier element and is connected with the material of the body of the card. This anchoring element is preferably an integrated component of the carrier element.

The anchoring element has high tensile strength relative to the material of the identification card. The connection of the carrier or anchoring element with the material of the identification card can be established by recesses or perforations in the edge of the anchoring element, which are penetrated by the material of the identification card during the laminating process, by appropriate laminating adhesives or by specific designing of the anchoring element.

16 Claims, 20 Drawing Figures

IDENTIFICATION CARD HAVING AN IC MODULE

The invention relates to an identification card or similar data carrier having an IC module for the processing of electrical signals, whereby the IC module along with its leads is arranged on a separate carrier element.

The German Auslegeschrift No. 29 20 012 describes an identification card having an integrated circuit. The module is arranged along with its leads on a carrier element produced independently of the card. The carrier element is held in the finished card by the cover film of the card in a recess of the card inlay.

The norm which holds generally for identification cards, and which is also supposed to be met by identification cards having an integrated circuit, requires, among other things, that the thickness of the card be 0.76 mm.

This thickness is taken up in the identification card proposed by the German Auslegeschrift largely by the carrier element, i.e. by the IC module and its leads as well as the encapsulation necessary to protect the sensitive arrangement. As relatively rigid materials are preferably used to encapsulate the module, the thin cover films are in danger when the identification card is bent. For the cover film is especially stretched at the transition points between the carrier element and the body of the card, since the carrier element adjusts itself to the general curve of the card only minimally due to its greater rigidity relative to the card materials. The border areas of the carrier element emerge from the body of the card and press against the cover films applying higher local pressure the more the card is bent. Thus principal stress zones arise at the transition points between the curve of the card and the lesser curve of the carrier element, which can cause an irreversible stretching of the cover film material in these areas when the card is bent accordingly. Fatigue of the cover film material must therefore be expected precisely in the area of the principal stress zones according to the mechanical stress of the card. The films can tear in this area, finally making the card unserviceable.

The problem of the invention consists in proposing an identification card of the above-mentioned kind which assures longer durability even under strong mechanical stress while still protecting the IC module well.

The problem is solved according to the invention by the features stated in the main claim. Advantageous developments of the invention are the subject-matter of sub-claims.

The anchoring element can be an integrated component of the carrier element. During the production of the identification card the module carrier is connected with the card core by the anchoring element. High-tensile material which is thermostable in the laminating temperature range and can accommodate without fatigue bending stress even for a long period of time, is preferably used for the anchoring element.

The anchoring element can be arranged in the center plane of the carrier element. But it is also possible to provide the anchoring at the upper and/or lower side of the carrier element.

The anchoring element can also be added to the card laminate during production of the card. In any case the durability of the card is considerably improved even in the case of relatively strong mechanical stress over a long period of time.

The use of the anchoring element according to the invention also has the advantage that the card thickness prescribed by the norm can be better used in regard to a thicker encapsulation of the sensitive arrangement.

It is possible, for example, to dispense with one or both of the cover films to incorporate the carrier element, since they are not necessarily required to mount the carrier element. The thickness of the carrier element can thus be identical with the actual thickness of the card, for example when both cover films are dispensed with, thus attaining excellent protection of the IC module and its leads.

But even when the carrier element is still covered on both sides by films, these can be selected so as to be extremely thin, since the anchoring element accommodates most of the stress.

The plane of the card on which the element is arranged is a function of very diverse limiting conditions. Some embodiments as well as further advantages of the invention are described in more detail in the following specification.

The drawings show:

Figure 6:
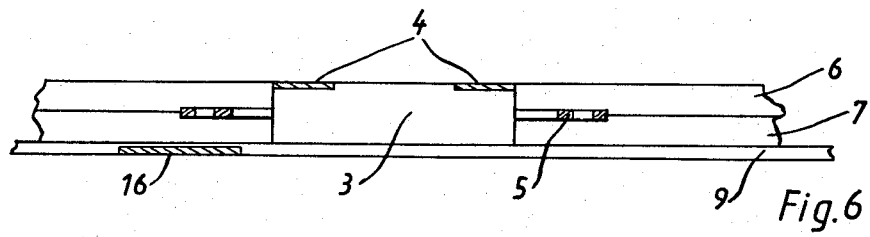
Figure 7:
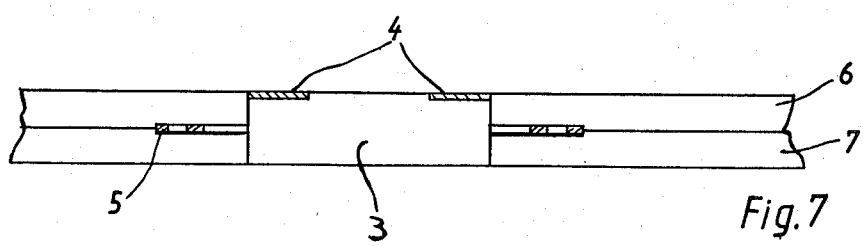
Figure 4:
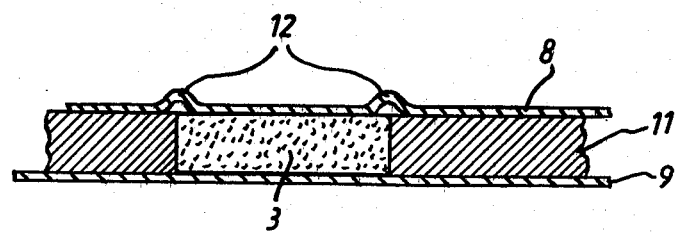
Figure 5:
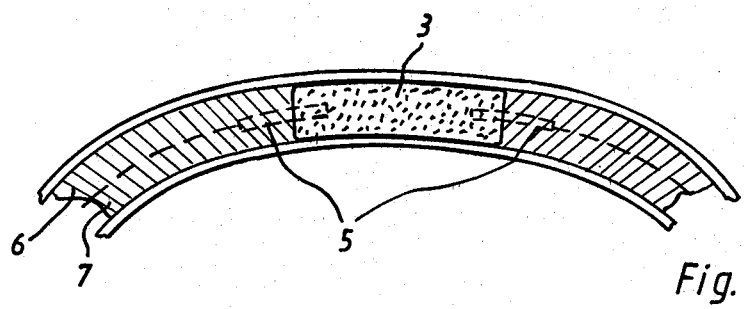
Figure 8:
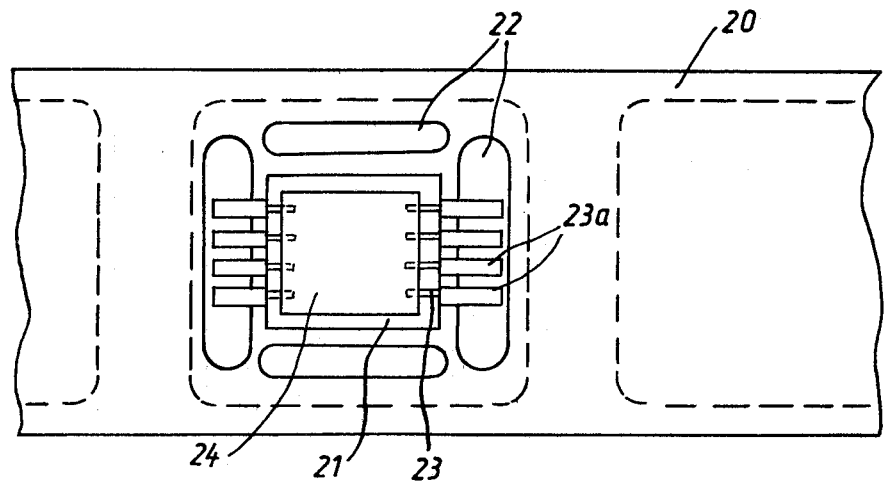
Figure 9:
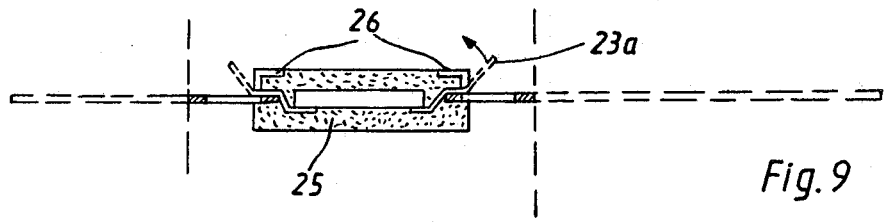
Figure 10:
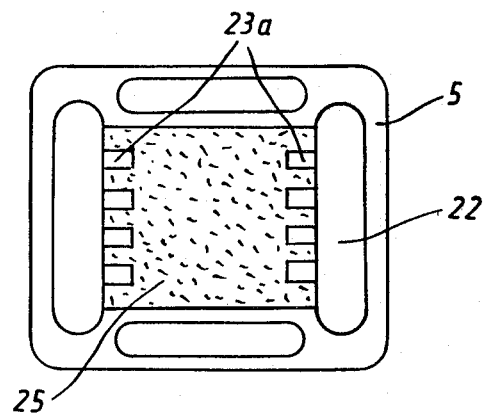
Figure 11:
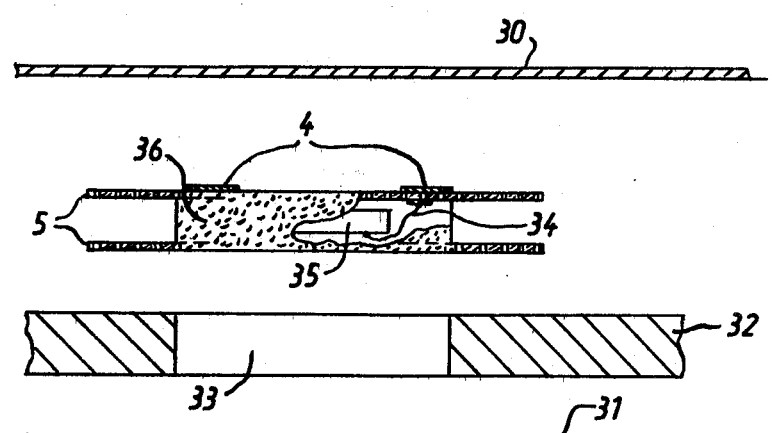
Figure 12:
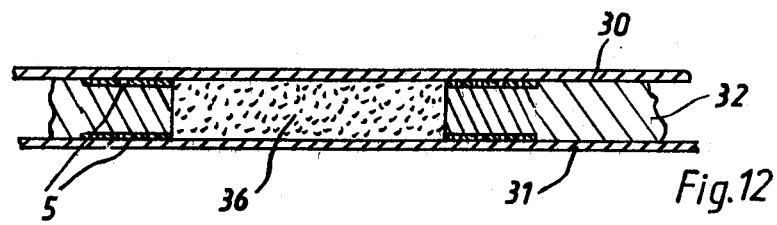
Figure 13:
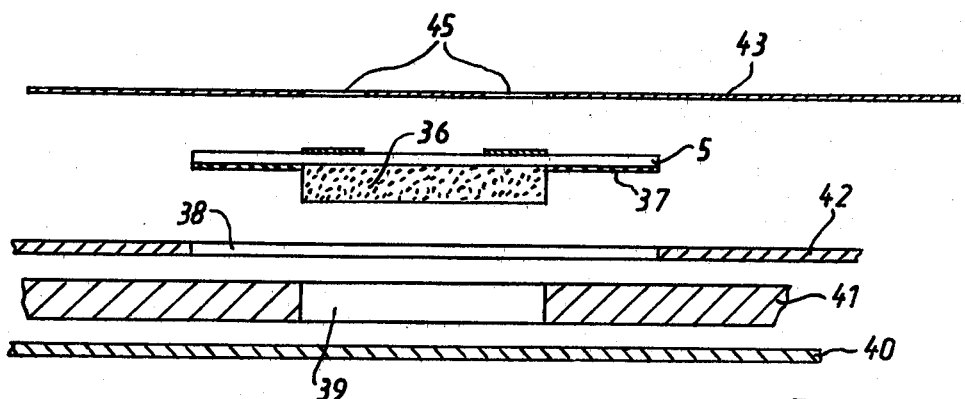
Figure 14:
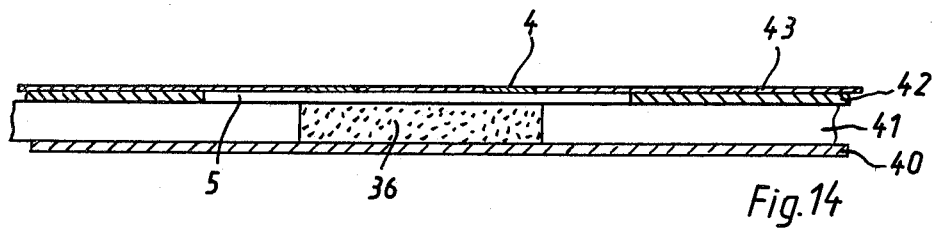
Figure 15:
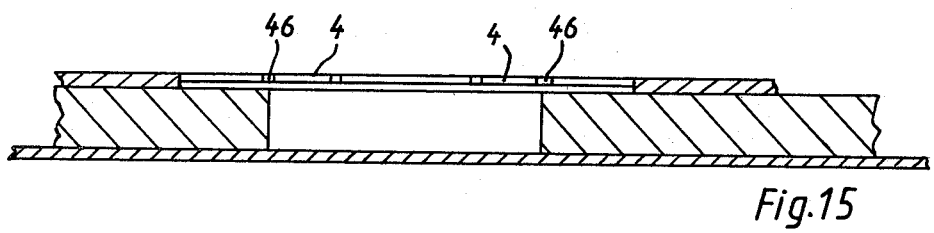
Figure 16:
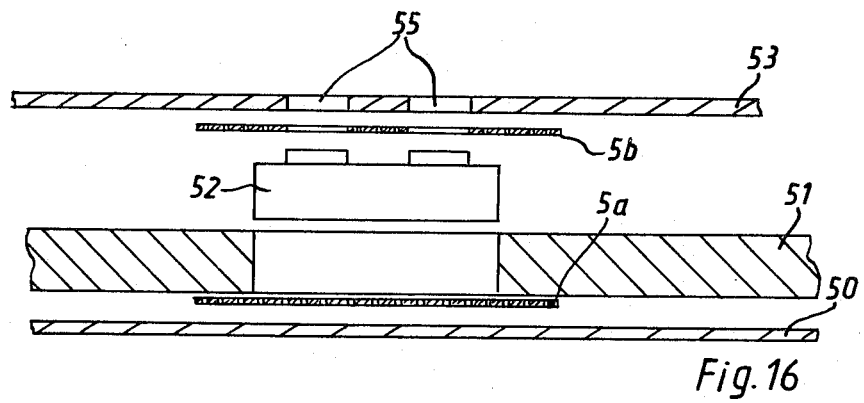
Figure 17:
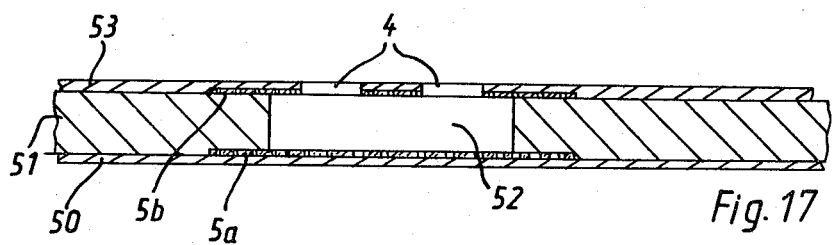
Figure 18:
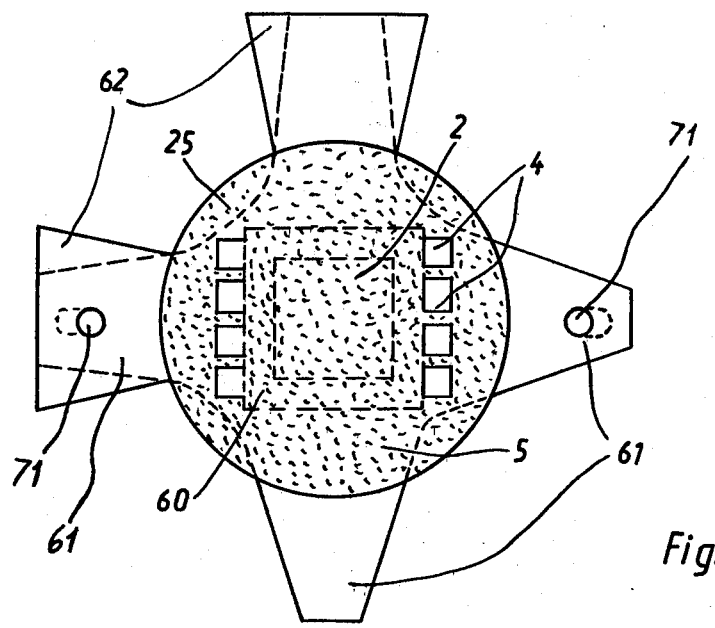
Figure 19:
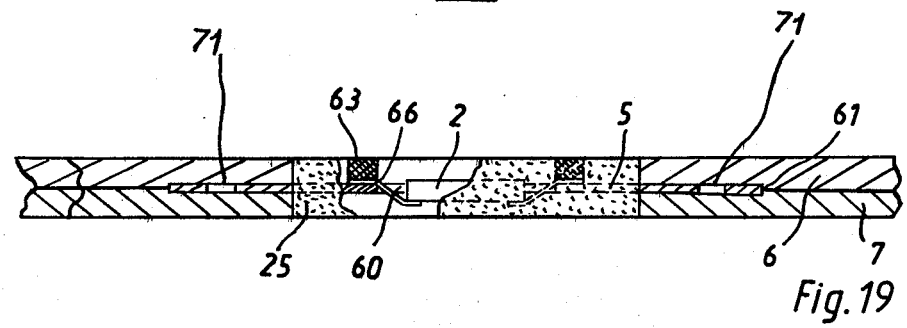
Figure 20:
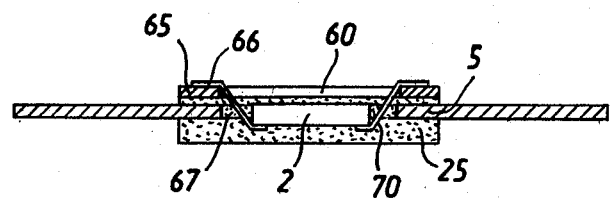

FIG. 4 is an identification card according to prior art after being bent several times, FIG. 5 is an identification card according to the invention in a bent state, FIG. 6 is an identification card without a cover film on the front, FIG. 7 is an identification card without cover films on the front and back, FIGS. 8, 9, 10 are procedural stages in the production of a carrier element according to the invention, FIG. 11 is an identification card in which the carrier element has an anchoring frame on the front and back, FIG. 12 is the identification card of FIG. 11 after lamination, FIG. 13 is an identification card having the carrier element on the surface, FIG. 14 is the identification card of FIG. 13 after lamination, FIG. 15 is an identification card in which the contacting spaces have been etched out, FIG. 16 is an identification card in which the anchoring frames are added to the card laminate during the laminating process, FIG. 17 is the identification card of FIG. 16 after lamination, FIG. 18 is a carrier element in which the anchoring frame is present in the form of small vanes, FIG. 19 is the carrier element of FIG. 18 in cross-section, and FIG. 20 is a carrier element with a carrier film for the module and a separate anchoring frame.

Figure 1:
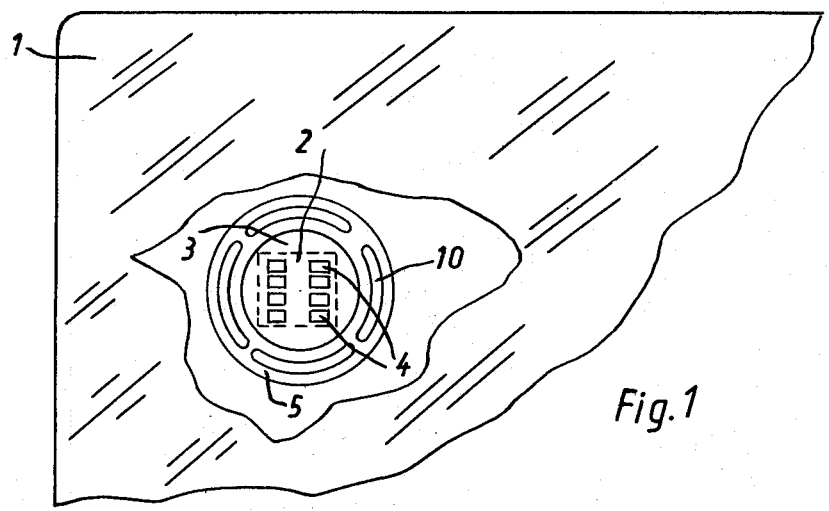
FIG. 1 is an identification card having a carrier element and anchoring frame.

FIG. 1 shows the segment of an identification card 1 in one embodiment, in which the carrier element 3 is located. The IC module 2 is resting inside the carrier element, and its leads are connected with contact surfaces 4. All around the carrier element an anchoring frame 5 is provided, which in this embodiment is provided with recesses or punctures 10 to fasten the elements in the identification card.

Figure 2:
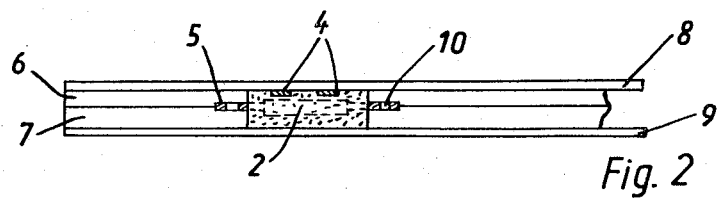
FIG. 2 is the identification card of FIG. 1 in cross-section.

FIG. 2 shows the various films or layers of the identification card in cross-section. The two core films 6 and 7 as well as cover films 8 and 9 are connected with each other by using heat and pressure. The card material that passes into the softening phase and finally into the melting phase in the process, penetrates the recesses, so that films 6,7 connect seamlessly with one another inside the recesses. The carrier element is thus attached in the identification card. In the embodiment shown the anchoring frame is an integrated component of the carrier element. The production of this type of element is discussed in more detail below.

An important function of the anchoring element will be explained in more detail on the basis of FIGS. 3 to 5 in the following.

Figure 3:
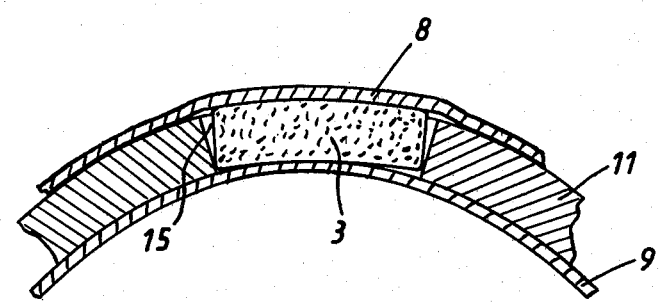
FIG. 3 is an identification card according to prior art in a bent state.

FIGS. 3 and 4 show a card known in prior art. Carrier element 3 is arranged in a window 15 of the core film 11 and is kept in this position by cover films 8 and 9. If the card is bent, the carrier element emerges from the card window at its border areas and presses against the cover film especially in these areas.

This behavior is due to, among other things, the greater rigidity of the carrier element 3 relative to the core film 11. An identification card should be flexible in the interest of more facile handling, whereas the carrier element should be as rigid as possible to protect the electronic arrangement.

For the reasons mentioned cover film 8 can be overstretched in the area of the endangered zones when the card is bent several times, which may easily lead to bulges 12 in the cover film material, as shown in FIG. 4. When the card is no longer bent, it is also possible for the cover film to tear in the area of the critical zones after being used for a while, which finally makes the card unserviceable. The same is naturally true of the cover film on the back. In the identification card shown in FIG. 5 anchoring frame 5 of carrier element 3 prevents overstretching of the cover films, since the frame compensates most of the mechanical stress when the card is bent. The border areas of the carrier element emerge only slightly from the window of the core film. The transition from the curve of the card to the curve of the carrier element is considerably more homogeneous relative to the card construction shown in FIG. 3, which is very advantageous for the durability of the cover films or the entire card. The anchoring frame, which accommodates most of the stress, consists preferably of material highly resistant to tearing and breaking and which behaves thermostably in the usual laminating temperature range. Polyester, polyimide, synthetics reinforced with glass fiber, nylon fabrics, and so on, are materials having such properties.

As already mentioned, the cover films 8,9 of the card laminate are greatly relieved in the case of the identification card having an IC module according to the invention, when the card is bent. This has the advantage that the cover films can be selected so as to be very thin without limiting the useful life or durability of the card. When the cover films are thin the carrier element can be selected so as to be accordingly thick, on the other hand, and thus the encapsulation of the IC module can be improved for protection against mechanical stress.

The use of an anchoring frame according to the invention also allows for the possibility of dispensing with one or both of the cover films.

FIG. 6 shows a card construction having the two films 6 and 7 containing the anchoring frame and a cover film 9 on the back. In this embodiment the contact surfaces of the module are automatically located on the surface of the card after the carrier element has been incorporated in the identification card. The cover film on the back can be used, for example, for embedding a magnetic stripe 16.

FIG. 7 shows an identification card in its most simple construction. It only comprises films 6,7, which contain the anchoring frame 5 to mount carrier element 3. The entire thickness of the card can be used for the thickness of the carrier element or for the encapsulation of the IC module and its sensitive leads when both cover films are dispensed with. This improves the protection of the arrangement against mechanical stress and offers more free space for the construction of the IC carrier element.

In the following the production of a carrier element having an anchoring frame is described on the basis of an example with reference to FIGS. 8, 9 and 10.

The film 20 made of insulating material is first subjected to a punching process, whereby window 21 as well as recesses 22 are formed. Film 1 is then laminated with a conductive layer, out of which the leads 23 and their contact surfaces 23a are etched according to the known procedure. After contacting the IC module 24 arranged in window 21, virtually only the IC module is provided with a cast casing 25, as shown in FIG. 9. During the casting process recesses 26 can be provided if the mold is designed accordingly, which are adapted to contact surfaces 23a and into which the latter are finally embedded, attached with an appropriate adhesive.

FIG. 10 shows the carrier element punched out of film 20 with cast casing 25, contact surfaces 23a and anchor frame 5 having recesses 22 and connected with the cast casing.

Film 20 can also be made of conductive material on which the leads and contact surfaces are then attached in the form of a so-called "contact spider" during the contacting of the module. After the module is contacted the conductive film is severed at all the places which could cause a short-circuit between the leads and/or contact surfaces.

In the following, examples of embodiments according to the invention shall be discussed in which the anchoring frame is provided on the upper side or else on the upper and lower sides of the carrier element.

FIGS. 11 and 12 show a segment of an identification card having the carrier element according to the invention in a non-laminated and a laminated state.

The laminate comprises cover films 30,31 and core film 32 provided with through hole 33. The anchoring frame 5 can be a perforated film. Contact surfaces 4 of the film are through hole plated on its back and connected there with the IC module 35 by means of thin golden wires 34. Other contacting techniques are also possible. A cast casing 36 is provided in the area of the IC module and the leads to protect the arrangement. During the casting process a second anchoring element can be attached to the lower side of casing 36. Films highly resistant to tearing and breaking are again used as anchoring elements. Along with polyester, films reinforced with glass fiber and nylon fabrics soaked in appropriate resins can also be used, for example. Since the materials used are thermostable in the laminating temperature range, the films are perforated, for example, in order to establish a connection between the films containing the anchoring frame. The perforations must be large enough to be penetrated by the film material when it is in its flowing stage during the laminating process.

FIG. 12 shows the finished laminated identification card. In this embodiment both the front cover film and the back cover film are stabilized by the anchoring frame 5 laminated in. The carrier element fits homogeneously into the card structure. Bending stress occurring during use is distributed evenly, thus allowing for a long useful life of the card.

FIGS. 13 and 14 show a card construction in which the connection of the anchoring frame with the body of the card is not established by recesses or perforations. The carrier element can be produced as described in connection with FIG. 11 or FIG. 9. Anchoring frame 5, for example, a polyester or polyimide film, is coated in this embodiment with a laminating adhesive 37. It is also possible to use laminating adhesive in the form of a film instead of the adhesive. During the laminating process the anchoring frame is firmly connected with the card core by means of the laminating adhesive. Molded body 36, which can also be provided with a laminating adhesive on its underside, is resting in a recess 39 of core film 41. A recess 38 is provided for the anchoring frame in cover film 42.

The carrier element is arranged in the card laminate in such a way that the contact surfaces are automatically located on the surface of the card after incorporation of the element. The thickness of cover film 42 is also used for the incorporation of the carrier element, which benefits a thicker encapsulation of the IC module and its leads.

As can be seen in the figures, contacts 4 etched out of a conductive coating appear as raised surfaces on the anchoring frame. In order to attain a completely flat surface for the identification card, the card laminate can also be covered with a very thin film 43 fitted to the contact surfaces, having corresponding windows 45 in the area of the contact surfaces. Although this film is very thin, there is no danger of it tearing in the area of the carrier element due to premature fatigue, since the film is also stabilized by the anchoring frame.

Film 43 covering the surface of the card can be dispensed with if the contacting area is designed as in the embodiment shown in FIG. 15.

In the case of the identification card shown in FIG. 15, not the contacts 4, but the spaces 46 insulating the contacts from each other, are etched out of the conductive material. Spaces 46 can finally be filled with an insulating material in order to achieve an even contacting surface.

FIGS. 18 and 19 show a top view and cross-section of a carrier element in which the anchoring element 5 has several small vanes 61,62 emerging in the middle of the cast casing 25.

The form shown in FIG. 18 is preferably punched out of an appropriate carrier film before a IC module is contacted. After the module 2 is contacted, the carrier film is provided with a cast casing 25 in such a way that the ends of the anchoring frame extend unsupported out of the casing in the form of small vanes 61,62. Contact surfaces 66 of the IC module receive bumps 63 made of conductive material before the casting process, which are finally on a plane with the surface of the cast casing 25. As shown in FIG. 18, small vanes 61,62 are arranged diametrically opposite each other in pairs. Vanes 61 are formed in such a way that they taper trapezoidally outwards, whereas vanes 62 have a dovetailed shape. Due to the design of vanes 61 the anchoring frame, which is held in the identification card between films 6 and 7, can be displaced parallel to the surface of the card in cases of great bending stress. Bending stress on the card is thus transferred only to a very small extent to the carrier element containing the sensitive components.

The design of small vanes 62 assures a firm anchoring of frame 5 in the card laminate on whatever side is opposite the displaceable side.

However, it is also possible to design all the small vanes of the anchoring frame in such a way (cf. broken lines) that there is no firm anchoring parallel to the surface of the card. The carrier element is in any case firmly connected with the card laminate perpendicular to the surface of the card.

In the case of the last-mentioned embodiment, it is possible that the carrier element is pressed out of the card body when the identification card is sharply bent. This can be prevented by providing recesses in the anchoring frame, as already discussed for FIG. 1. Proceeding from the discussion in connection with FIG. 1, two small vanes opposite one another are each provided with a recess 71 in FIGS. 18 and 19. During the production of the identification card, recesses 71 are penetrated by the softening card material, so that layers 6 and 7 of the card connect firmly with one another even in the area of the recess (FIG. 19). It has proved to be the case that the initially rigid connection of a vane with the card body turns into a flexible holder after the card has been used for a short time. This is because, when the card is bent, recess 71 of the vane takes the shape of a slot due to the card material filling the recess and rigidly connected with the card body (dotted lines for recess 71), which slot allows for the vane to be displaced within certain limits in the card. Recess 71 in vane 61 does not necessarily have to be designed concentrically, as shown in the figures. It can also have a shape (e.g. oval) facilitating the desired deformation. The material properties (e.g. tensile strength, elasticity, etc.) of the identification card and the anchoring frame must be taken into consideration in the process.

FIG. 20 shows an embodiment of the invention in which the anchoring frame 5 is not identical with the film on which the IC module is mounted. IC module 2 is contacted on film 65, whereby leads 70 are bent at right angles so that the module is below the film plane. The module placed in a window 67 of anchoring frame 5 is finally provided with a cast casing 25 (e.g. injection mold).

Because anchoring frame 5 communicates with the module carrier (film 65) as a separate element via molded body 25, mechanical bracing at the anchoring frame is not directly transferred to the sensitive arrangement. As the film 65 bearing the module is located on the surface of the carrier element, no bumps are necessary to lead the contact surfaces out of the cast casing. A final advantage is that the selection of the film (5) for the anchoring frame does not depend on the specifications prescribed for films (65) to contact IC modules.

In the embodiments described above, the anchoring frame was always a firm component of the carrier element, i.e. it was connected during the production of the carrier element.

However, as shown in FIGS. 16 and 17, it is also possible on the basis of the invention to add the anchoring frame(s) to the card laminate during the production of the card.

FIG. 16 shows the as yet unlaminated identification card with lower cover film 50, an anchoring frame 5a below the carrier element, core film 51 with the recess for the carrier element 52, an anchoring frame 5b above the carrier element and upper cover film 53. Upper anchoring frame 5b as well as upper cover film 53 are provided with corresponding recesses 54 and 55, respectively, so that contact surfaces 4 of the carrier element are located at the surface of the card in the finished laminated identification card, which is shown in FIG. 17. This embodiment is advantageous when anchoring frames are to be provided both above and below the carrier element, since the single elements can be simply placed one on top of the other during the lamination of the card.

It is to be preferred to the embodiment shown in FIG. 11 even when the anchoring frames are made of very rigid material, since this makes it more difficult to insert the carrier element equipped with anchoring frames.

What is claimed is:

1. In an identification card or similar data carrier comprising a card body having an opening therein; an IC module for the processing of electrical signals; leads extending from said module, and contacts disposed on said leads; a carrier supportably engaging said IC module and disposed in the opening in the identification card body, the improvement comprising at least one readily flexible anchoring element having a high tensile strength and being of little thickness relative to the thickness of said identification card; said anchoring element being located adjacent to the carrier periphery and connecting said identification card body with said carrier.

2. The identification card of claim 1 in which said anchoring element is a synthetic film having perforations or recesses which are penetrated by the material of the identification card body.

3. The identification card of claim 1 in which said card body comprises a core formed of two layers, and in which the anchoring element is formed of woven threads embedded between the layers of the core.

4. The identification card of claim 1, 2 or 3 in which the anchoring element is formed integrally with the carrier.

5. The identification card of claim 1 in which said carrier includes a molded casing, and the anchoring element is partly embedded in said casing.

6. The identification card of claim 5 in which the anchoring element is located in the central plane of the carrier and has a peripheral edge portion with apertures therethrough surrounding the carrier.

7. The identification card of claim 4 in which the anchoring element has a surface arranged flush with one surface of the carrier and in parallel adjacent relationship to an exterior surface portion of said card.

8. The identification card of claim 7 in which an additional anchoring element is provided having a surface arranged flush with a surface of the carrier opposite said one surface thereof.

9. The identification card of claim 7 in which contacts on said exterior surface portion of the card are connected directly with the IC module by leads.

10. The identification card of claim 1 in which the anchoring element is a synthetic film which is connected with the identification card body by means of a laminating adhesive.

11. The identification card of claim 1 in which said card comprises two layers defining said card body; said card body has opposed parallel outer surfaces, and said carrier has opposed parallel outer surfaces, and the anchoring element is located along the central plane of the carrier and is attached between said layers of the card in such manner that opposed outer surfaces of the carrier are substantially coplanar with the opposed outer surfaces of the identification card.

12. The identification card of claim 1 in which said card has a core formed of two card layers and the anchoring element is in the form of vanes which are anchored between said layers.

13. The identification card of claim 12 in which at least one anchoring vane of a pair of vanes diametrically opposite each other is formed in such a way that it can be displaced in the card between said layers when a certain bending stress applied to said card is exceeded.

14. The identification card of claim 12 or 13 in which one of the vanes has a dovetailed shape and the other has a trapezoidal shape tapering outwardly.

15. The identification card of claim 12 in which at least two vanes diametrically opposite each other have a trapezoidal shape, and have perforations or recesses which are penetrated by the material of the identification card layers.

16. The identification card of claim 1 in which said IC module is disposed in a molded casing, and the anchoring element comprises a card layer having a punched out window and the molded casing is placed in said punched-out window.

* * * * *